United States Patent
Mao et al.

(10) Patent No.: US 9,112,008 B2
(45) Date of Patent: Aug. 18, 2015

(54) MEMS DEVICE AND METHOD OF FORMING THE SAME

(75) Inventors: Jianhong Mao, Shanghai (CN); Fengqin Han, Shanghai (CN)

(73) Assignee: LEXVU OPTO MICROELECTRONICS TECHNOLOGY (SHANGHAI) LTD., Shanghai (CN)

(*) Notice: Subject to any disclaimer, the term of this patent is extended or adjusted under 35 U.S.C. 154(b) by 135 days.

(21) Appl. No.: 13/637,021

(22) PCT Filed: Jan. 26, 2011

(86) PCT No.: PCT/CN2011/070627
§ 371 (c)(1),
(2), (4) Date: May 17, 2013

(87) PCT Pub. No.: WO2011/116642
PCT Pub. Date: Sep. 29, 2011

(65) Prior Publication Data
US 2013/0221450 A1    Aug. 29, 2013

(30) Foreign Application Priority Data

Mar. 25, 2010   (CN) .......................... 2010 1 0135707

(51) Int. Cl.
| H01L 21/00 | (2006.01) |
| H01L 29/772 | (2006.01) |
| H01L 21/28 | (2006.01) |
| H01L 29/51 | (2006.01) |

(Continued)

(52) U.S. Cl.
CPC ...... *H01L 29/7722* (2013.01); *H01L 21/28176* (2013.01); *H01L 29/51* (2013.01); *H01L 29/66477* (2013.01); *H01L 29/66545* (2013.01); *H01L 29/66606* (2013.01); *H01L 29/78* (2013.01)

(58) Field of Classification Search
CPC ... H01L 29/51; H01L 29/78; H01L 29/66606; H01L 29/7722; H01L 29/66545; H01L 29/6647; H01L 21/28176
USPC .......................................................... 257/501
See application file for complete search history.

(56) References Cited

U.S. PATENT DOCUMENTS

| 5,492,858 A * | 2/1996 | Bose et al. ..................... 438/437 |
| 6,291,331 B1 * | 9/2001 | Wang et al. ................... 438/618 |

(Continued)

FOREIGN PATENT DOCUMENTS

| CN | 1522463 A | 8/2004 |
| CN | 101521230 A | 9/2009 |

(Continued)

*Primary Examiner* — Victor A Mandala
*Assistant Examiner* — Quovaunda V Jefferson
(74) *Attorney, Agent, or Firm* — Kilpatrick Townsend & Stockton LLP (57) ABSTRACT

A MEMS device and a forming method thereof are provided. The MEMS device includes a semiconductor substrate with a well region formed therein. A source region, a drain region and a channel region are formed in the well region. The source region and the drain region are covered by an isolating layer, and the channel region is covered by a gate dielectric layer. The device further includes a gate electrode layer which is disposed above the gate dielectric layer, with a gap disposed therebetween. The width of the gap corresponds to the width of the channel region. The MEMS can work well at high voltages with less leakage current.

8 Claims, 5 Drawing Sheets

(51) Int. Cl.
*H01L 29/78* (2006.01)
*H01L 29/66* (2006.01)

(56) References Cited

U.S. PATENT DOCUMENTS

2001/0025970 A1* 10/2001 Nozaki et al. .................. 257/255
2006/0145240 A1* 7/2006 Park et al. ..................... 257/315
2007/0040637 A1* 2/2007 Yee et al. ........................ 335/78
2008/0055976 A1* 3/2008 Aritome ................... 365/185.01
2009/0127590 A1* 5/2009 Shimada ........................ 257/254

FOREIGN PATENT DOCUMENTS

EP            0157541       *   9/1985
WO        2009/128084  A1     10/2009

* cited by examiner

MEMS DEVICE AND METHOD OF FORMING THE SAME

CROSS REFERENCE TO RALATED APPLICATIONS

The present application claims priority to International Application No. PCT/CN2011/070627, entitled "MEMS DEVICE AND METHOD OF FORMING THE SAME", filed on Jan. 26, 2011, which claims priority to Chinese Patent Application No. 201010135707.5 filed on Mar. 25, 2010, and entitled "MEMS DEVICE AND METHOD OF FORMING THE SAME", the entire disclosures of which are incorporated herein by reference.

FIELD OF THE DISCLOSURE

The present disclosure relates to micro-electromechanical system (MEMS) techniques, and more particularly, to a MEMS device and a method for forming the same.

BACKGROUND OF THE DISCLOSURE

Micro-electromechanical system (MEMS) techniques, as advanced manufacturing techniques, arise from 1990s, and are widely used to improve the standard and quality of life and enhance national strength. MEMS techniques feature a strong interdisciplinary characteristic. Recently, silicon-based processes already become main processes to manufacture MEMS devices. Nevertheless, due to the complexity to manufacture MEMS, difficulties in integration of MEMS with semiconductor processes have become a limit to MEMS development.

Semiconductor processes have advantages like low cost, high accuracy and consistency. By integrating MEMS processes with semiconductor processes, not only above mentioned advantages can be taken, but also defects of semiconductor devices formed in semiconductor processes may be overcome. Take the gate of a MOS transistor as an example, a conventional gate includes a gate dielectric layer and a gate electrode layer formed on the gate dielectric layer. More information of the gate may be referred to Chinese patent publication No. 1522463. Usually, the gate dielectric layer includes silicon dioxide and the gate electrode layer includes a conducting material such as polysilicon or metal. However, leakage current is likely to occur due to change of interfacial bonding state between the gate dielectric layer and the gate electrode layer, which may affect the normal operation of a transistor.

BRIEF SUMMARY OF THE DISCLOSURE

Embodiments of the present disclosure provide a MEMS device and a method for forming the same, which reduce the gate leakage current and may be compatible with current semiconductor processes.

One embodiment of the present disclosure provides a MEMS device, including: a substrate; a well region formed in the substrate; a source region, a drain region and a channel region formed in the well region; an isolating layer formed on the source region and the drain region; a gate dielectric layer formed on the channel region; and a gate electrode layer formed above the gate dielectric layer with a gap between the gate dielectric layer and the gate electrode layer, wherein the gap has a width corresponding to a width of the channel region.

Optionally, the gate electrode layer has a single layer structure or a multi-layer stack structure.

Optionally, the single layer structure includes conducting material.

Optionally, the gate electrode layer has a three-layer stack structure including a metal layer, a silicon oxide layer formed on the metal layer and a silicon nitride layer formed on the silicon oxide layer.

Optionally, the isolating layer has a multi-layer stack structure,

Optionally, the isolating layer includes a protecting layer, a barrier layer and an interlayer dielectric layer successively formed on the well region.

Optionally, the protecting layer includes silicon oxide.

Optionally, the barrier layer includes silicon nitride.

Optionally, the interlayer dielectric layer includes a material selected from undoped silicon oxide and doped silicon oxide, Optionally, the gate electrode layer includes a width corresponding to the width of the channel region.

Optionally, the source region and the drain region have a doping type opposite to a doping type of the well region.

Another embodiment of the present disclosure further provides a method for forming a MEMS device, including: providing a substrate with a well region formed therein, wherein a source region, a drain region and a channel region are formed in the well region;

forming an isolating layer on the substrate;

forming an opening in the isolating layer to expose the channel region and portions of the source region and the drain region neighboring the channel region;

forming a gate dielectric layer on a bottom surface of the opening;

forming a filling layer to fill up the opening, wherein a top surface of the filling layer levels with a top surface of the isolating layer;

forming a gate electrode layer on the filling layer and the isolating layer; and removing the filling layer to form a gap between the gate electrode layer and the gate dielectric layer.

Optionally, the step for forming the gate electrode includes: forming a gate electrode film on the filling layer and the isolating layer; forming a patterned photoresist layer corresponding to the gate electrode layer on the gate electrode film; and etching the gate electrode film using the patterned photoresist layer as a mask to form the gate electrode layer.

Optionally, the gate electrode layer exposes portions of the filling layer.

Optionally, the gate electrode layer has a single-layer structure or a multi-layer stack structure.

Optionally, the single-layer structure includes conducting material.

Optionally, the gate electrode layer has a three-layer stack structure including a metal layer, a silicon oxide layer formed on the metal layer and a silicon nitride layer formed on the silicon oxide layer.

Optionally, the gate electrode layer includes a width corresponding to a width of the channel region.

Optionally, the filling layer includes a material with relatively high etching selectivity with the gate electrode layer and the gate dielectric layer.

The method for forming a MEMS device provided by the present disclosure can be compatible with the conventional semiconductor manufacturing process, therefore new materials and manufacturing techniques are not needed. In addition, in the formed MEMS device, the gate electrode layer and the gate dielectric layer are not directly in contact with each other due to the gap located therebetween. Leakage current caused by interfacial phase change may be avoided. The MEMS device provided by the present disclosure has lower gate leakage current and can withstand higher voltage.

BRIEF DESCRIPTION OF THE DRAWINGS

The above described and other features and advantages will become more apparent to those of ordinary skill in the art by describing in detail exemplary embodiments with reference to the attached drawings. The same reference numbers may be used in different drawings to identify the same or similar elements. The figures are not drawn to scale, and it is noted that the drawings are provided for illustrative purposes only.

DETAILED DESCRIPTION OF THE DISCLOSURE

As described in the background of the present disclosure, the conventional gate structure of a transistor includes a gate dielectric layer and a gate electrode layer formed on the gate dielectric layer. Due to the material difference between the gate dielectric layer and the gate electrode layer, leakage current may occur, which affect the normal operation of the transistor.

Therefore, embodiments of the present disclosure provide a MEMS device and a method for forming the same. The MEMS device includes a gate dielectric layer and a gate electrode layer, with a gap disposed between the gate dielectric layer and the gate electrode layer. The gate electrode layer is absorbed to or floated above the gate dielectric layer by electrostatic force, thereby controlling the switch of the MEMS device. By employing the device or the method, the leakage current between the gate dielectric layer and the gate electrode layer in the semiconductor device may be avoided. Furthermore, the MEMS device and the formation method provided by embodiments of the present disclosure can be compatible with semiconductor techniques, which may save R&D costs.

Hereafter, the present disclosure will be described in detail with reference to embodiments in conjunction with the accompanying drawings. The above described features and advantages will become more apparent.

Figure 1:
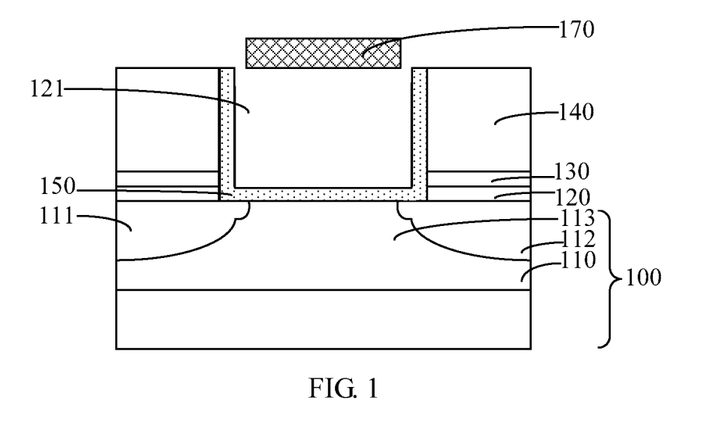
FIG. 1 is a schematic cross-sectional view of a MEMS device according to an embodiment of the present disclosure.

FIG. 1 is a schematic cross-sectional view of a MEMS device according to an embodiment of the present disclosure. Referring to HG. 1, the MEMS device includes: a substrate 100; a well region 110 formed in the substrate 100; a source region 111, a drain region 112 and a channel region 113 formed in the well region 110; and an isolating layer formed on the source region 111 and the drain region 112. The isolating layer may have a single-layer structure or a multi-layer stack structure. When the isolating layer has a single-layer structure, it includes dielectric material. When the isolating layer has a multi-layer stack structure, it includes a protecting layer 120, a barrier layer 130 formed on the protecting layer 120 and an interlayer dielectric (ILD) layer 140 formed on the barrier layer 130. In the embodiment, as an example, the isolating layer has a multi-layer stack structure. The MEMS device provided in the embodiment further includes: an opening 121, formed in the ILD layer 140 and exposing the well region 110; a gate dielectric layer 150 formed on a bottom surface of the opening 121; and a gate electrode layer 170 formed above the gate dielectric layer 150, wherein a gap is disposed between the gate dielectric layer 150 and the gate electrode layer 170, and the gap includes a width corresponding to a width of the channel region 113.

Figure 2:
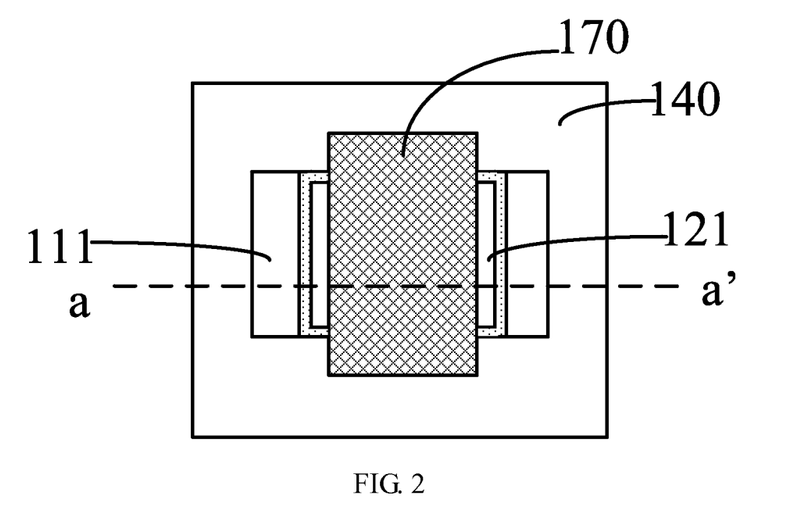
FIG. 2 is a schematic top view of a MEMS device according to an embodiment of the present disclosure.

FIG. 2 is a schematic top view of the MEMS device provided in the embodiment. FIG. 1 is a schematic cross-sectional view along the a-a' direction shown in FIG. 2. As shown in FIG. 2, the gate electrode layer 170 is partially disposed on the ILD layer 140, and thus a gap is formed between the gate electrode layer 170 and the gate dielectric layer 150. It should be noted that, the gate dielectric layer 150 is shielded by the opening 121 and the gate electrode layer 170, and is not shown in FIG. 2.

Optionally, the substrate 100 may be an n-type silicon substrate, a p-type silicon substrate or a silicon-on-insulator (SOI) substrate.

The well region 110 has a first conducting type, either n-type or p-type. The following description will employ a p-type first conducting type and an n-type second conducting type as an example for illustration. The well region is formed rich a conventional ion doping process.

The source region 111 and the drain region 112 have an opposite conducting type with the well region 110, which is the second conducting type. Formation of the source region 111 and the drain region 112 may be referred to formation of a MOS transistor, applying the conventional ion doping process. After the formation of the source region 111 and the drain region 112, the well region between them becomes a channel region 113 which has the first conducting type.

The protecting layer 120 includes silicon oxide. The barrier layer 130 includes silicon nitride. The ILD layer 140 includes undoped silicon oxide or doped silicon oxide (which may be BPSG; PSG or BSG). The protecting layer 120, the barrier layer 130 and the ILD layer 1140 may be formed by a conventional deposition process, for example, a CVD process. The protecting layer 120 the barrier layer 130 and the ILD layer 140 constitute the isolating layer.

The opening 121 is formed by an etch process. The gate dielectric layer 150 includes silicon oxide and is formed by CVD. In the embodiment, the gate dielectric layer 150 is deposited on the bottom surface of the opening 121. However, silicon oxide may be formed on sidewalk of the opening 121 and on the ILD 140 when forming the gate dielectric layer 150. The silicon oxide formed on the sidewalk of the opening 121 and the ILD layer 140 may be removed, or kept to simplify the process. In the embodiment, the silicon oxide is kept to save the process steps. The gate electrode layer 170 may have a single-layer structure or a multi-layer stack structure. If the gate electrode layer 170 has a single-layer structure, the gate electrode layer 170 includes a conducting material, for example, polysilicon, doped polysilicon, Al, Cu, Ag or Au.

Preferably, the gate electrode layer 170 has a three-layer stack structure including a metal layer, a silicon oxide layer formed on the metal layer and a silicon nitride layer formed on the silicon oxide layer, which may improve the fatigue resistance of the metal layer and thus increase the life of the MEMS device.

It should be noted that the gate electrode layer 170 should have a width d1 larger than a width d2 of the channel region 113 to ensure that the channel region 113 is conductive when the MEMS device is switched on.

In the embodiment, the MEMS device may be switched on by applying an open circuit voltage on the gate electrode layer 170. The open voltage may be applied on an additional conducting plug (not shown in the drawings) which is arranged on the gate electrode layer 170 and connected with the metal layer of the gate electrode layer 170. When the open voltage is applied on the gate electrode layer 170, the gate dielectric layer 150 may have electric charges opposite with the gate electrode layer 170 due to the electrostatic induction. The gate electrode layer 170 is attracted by and comes in contact with the gate dielectric layer 150, and thus electric potentials of the gate dielectric layer and the gate electrode layer become the same. Therefore, the channel region 113 is switched on and the MEMS device is switched on. When the open circuit voltage is removed from the gate electrode layer 170, the gate electrode layer 170 is repelled by the gate dielectric layer 150 because electric charges in them have the same polarity. The gate electrode layer 170 reverts to the initial state and is isolated from the gate dielectric layer 150. Therefore, the MRMS device is switched off.

It should be noted that, in order to make the MEMS device work properly, preferably, the area of the opening 121 is selected within a range from about 0.01 $\mu m^2$ to about 25 $\mu m^2$, the thickness of the isolating layer is selected within a range from about 0.2 $\mu m$ to about 1 $\mu m$, and the thickness of the gate electrode layer 170 is selected within a range from about 500 Å to about 5000 Å (the thickness of the gate electrode layer 170 is also selected according to the width of the channel region 113). By employing these ranges, the gate electrode layer 170 is not likely to crack.

Figure 3:
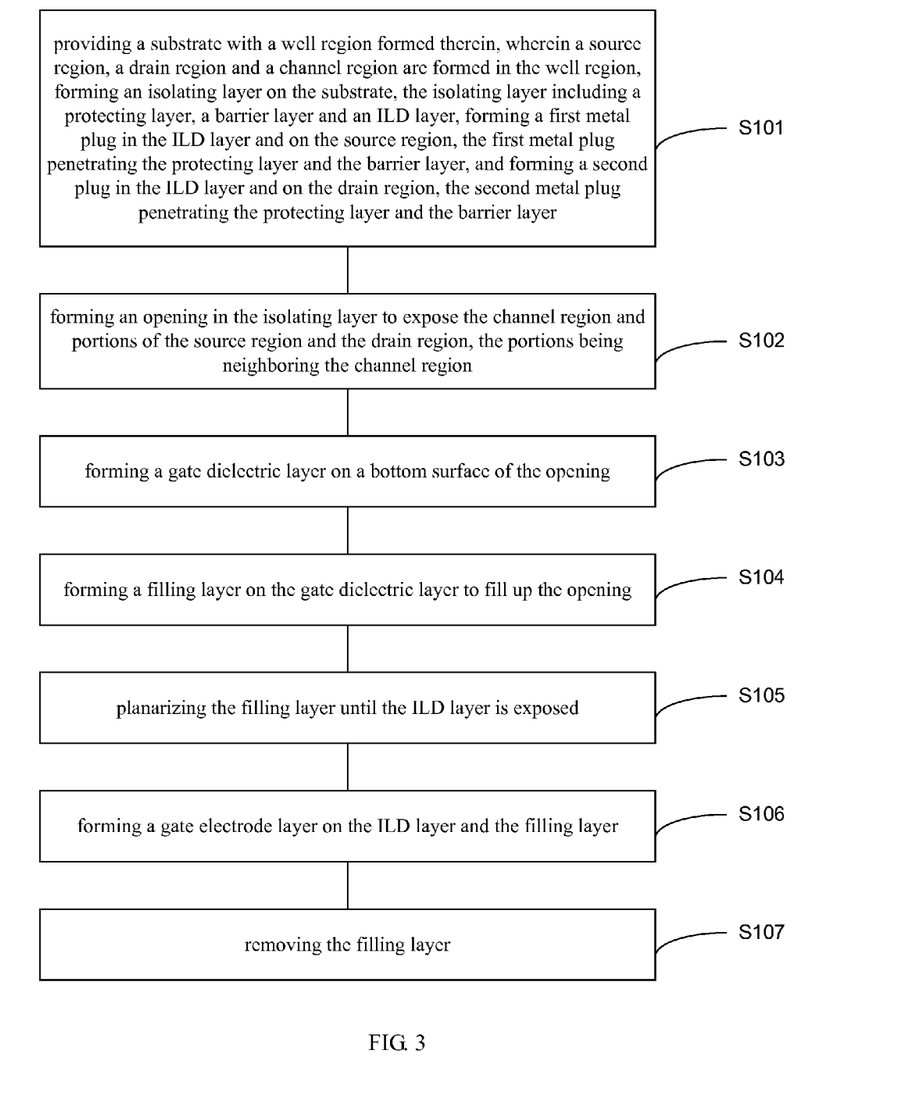
FIG. 3 is a flow chart illustrating a method for forming a MEMS device according to an embodiment of the present disclosure.

FIG. 3 is a flow chart illustrating a method for forming a MEMS device according to an embodiment of the present disclosure. The method includes: step S101, providing a substrate with a well region formed therein, wherein a source region, a drain region and a channel region are formed in the well region, forming an isolating layer on the substrate, the isolating layer including a protecting layer, a barrier layer and an ILD layer, forming a first metal plug in the ILD layer and on the source region, the first metal plug penetrating the protecting layer and the barrier layer, and forming a second plug in the ILD layer and on the drain region, the second metal plug penetrating the protecting layer and the barrier layer; step S102, forming an opening in the isolating layer to expose the channel region and portions of the source region and the drain region which are neighboring the channel region; step S103, forming a gate dielectric layer on a bottom surface of the opening; step S104, forming a filling layer on the gate dielectric layer to fill up the opening; step S105, planarizing the filling layer until the ILD layer is exposed; step S106, forming a gate electrode layer on the ILD layer and the filling layer; and step S107, removing the remained filling layer.

Hereinafter, the method for forming a MEMS device will be interrupted in detail with reference to accompanying drawings.

Figure 4:
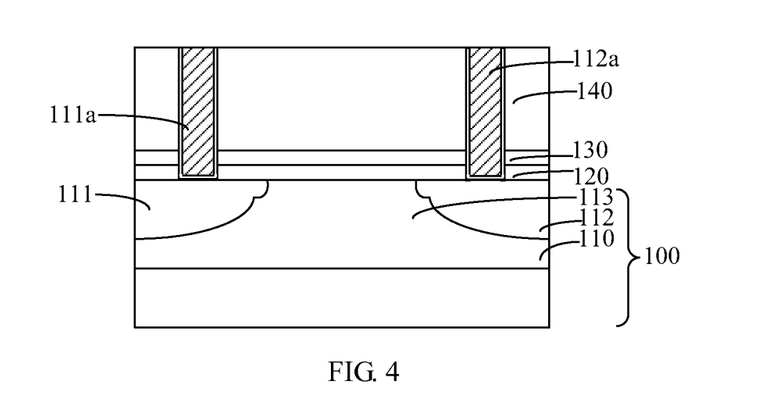
FIGS. 4 to 11 are schematic cross-sectional views of intermediate structures illustrating a method for forming a MEMS device according to an embodiment of the present disclosure.

Referring to FIG. 4, by performing step S101, a substrate 100 is provided. The substrate 100 may he an n-type silicon substrate, a p-type silicon substrate or a SOI substrate. In the embodiment, the substrate 100 is a p-type silicon substrate, which is illustrated as an example.

A well region 110 is formed in the substrate 100. The well region 110 may be n-type or p-type. In the embodiment, the well region 110 is n-type, which is illustrated as an example. The well region 110 is formed by a conventional ion doping process in which doping ions are n-type. It should be noted that, when the substrate 100 is p-type and the well region 110 is also p-type, subsequent steps may be performed directly; when the substrate 100 is p-type and the well region 110 is n-type, an ion doping process is required to dope n-type ions into the substrate 100 to form the n-type well region 110.

Referring to the standard MOS transistor manufacturing process, a sacrificial oxide layer may be further formed on the well region 110 after the formation of the well region 110. And thereafter an additional ion doping process is performed to the well region 110 to adjust the threshold voltage of the MEMS device. After the additional ion doping process, the sacrificial oxide layer may be removed.

Referring to FIG. 4, a source region 111, a drain region 112 and a channel region 113 are formed in the well region 110. The source region 111 and the drain region 112 are formed by performing an ion doping process to corresponding locations in the well region. Ions utilized in the ion doping process have an opposite electric type to the well region 110. The well region between the source region 111 and the drain region 112 is the channel region 113.

Referring still to FIG. 4, a protecting layer 120, a barrier layer 130 and an ILD layer 140 are successively formed on the substrate 100, which form an isolating layer. In other embodiments, the isolating layer may have a single-layer structure including dielectric material.

The protecting layer 120, adapted for protecting the substrate 100 from being hurt by a subsequent plasma etch process, includes silicon oxide. The barrier layer 130 includes silicon nitride. The barrier layer 130, as a stop mark of the subsequent etch process, is adapted for avoiding over etching the substrate 100. The ILD layer 140 may include silicon oxide, phosphorus doped silicon oxide or boron phosphorus doped silicon oxide. The ILD layer 140 is adapted for protecting the source region 111, the drain region 112, the channel region 113 and the substrate 100, and providing a platform for an interlayer metal layer formed subsequently.

Referring still to FIG. 4, a first metal plug 111a which penetrates the protecting layer 120 and the barrier layer 130 and is coupled to the source region 111 is formed in the ILD layer 140, and a second plug 112a which penetrates the protecting layer 120 and the barrier layer 130 and is coupled to the drain region 112 is formed in the ILD layer 140.

Formation of the first metal plug 111a and the second metal plug 112a may be performed as follows: a patterned photoresist layer corresponding the first metal plug 111a and the second metal plug 112a is formed on the ILD layer 140; with the patterned photoresist layer as a mask, the ILD layer 140 is etched until the source region 111 and the drain region 112 are exposed, so as to form vias (not shown in FIG. 4); the patterned photoresist layer is removed; and conducting material is filled into the vias so as to form the first metal plug 111a and the second metal plug 112a. To avoid the conducting material from diffusing into the ILD layer 140, a buffer layer including Ti/TiN or Ta/TaN may be formed on the vias' bottom surfaces and sidewalls before filling the conducting material.

Figure 5:
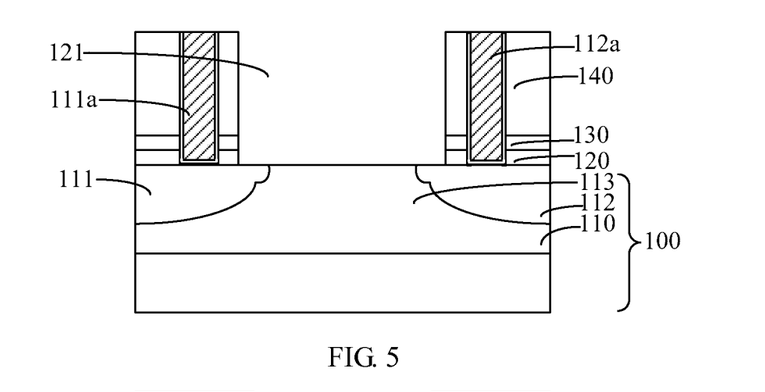

Referring to FIG. 5, by performing step S102, an opening 121, which exposes the channel region 113 and portions of the source region 111 and the drain region 112 which are neighboring the channel region 113, is formed in the isolating layer.

The opening 121 may be formed by a plasma etch process. Specifically, formation of the opening 121 includes: forming a patterned photoresist layer corresponding to the opening 121 on the ILD layer 140; and with the patterned photoresist layer as a mask, etching the ILD layer 140, the barrier layer 130 and the protecting layer 120 until the channel region 113 and the portions of the source region and the drain region are exposed.

Figure 6:
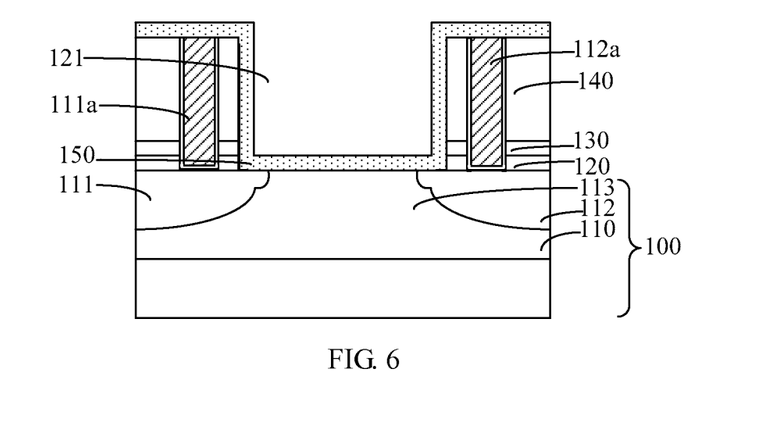

Referring to FIG. 6, by performing step S103, a gate dielectric layer 150 is formed on a bottom surface of the opening 121.

The gate dielectric layer 150 may include silicon oxide and be formed by a CVD process. It should be noted that, due to the deposition process applied, silicon oxide may be formed on sidewalls of the opening 121 and on the ILD layer 140 when forming the gate dielectric layer 150. The silicon oxide formed on the sidewalk of the opening 121 and the ILD layer 140 may be removed, or else, it may be kept to simplify the process. In the embodiment, the silicon oxide is kept to simplify the process steps.

Figure 7:
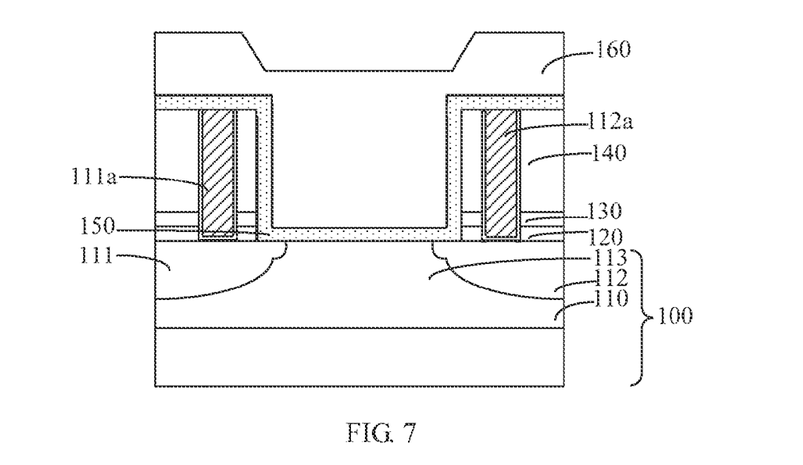

Referring to FIG. 7, by performing step S104, a filling layer 160 which fills up the opening 121 is formed on the gate dielectric layer 150.

The filling layer 160 is adapted for providing a platform to hold a gate electrode layer formed subsequently. The filling layer 160 includes a material with relatively high etching selectivity with the gate electrode layer and the gate dielectric layer.

Figure 8:
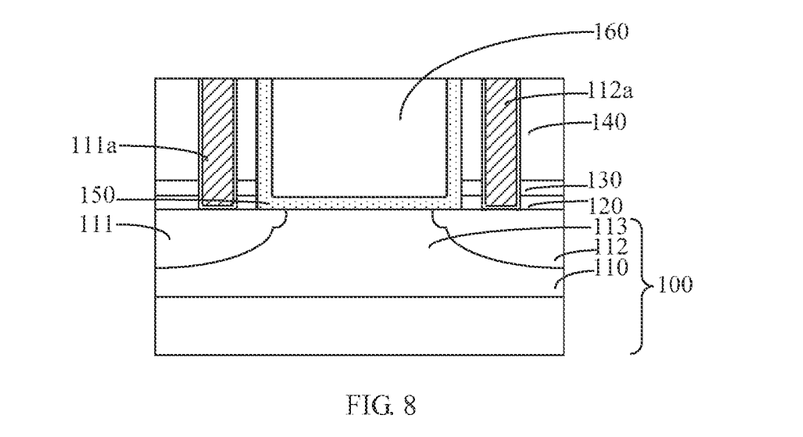

Referring to FIG. 8, by performing step S105, the filling layer 160 is planarized until the ILD layer 140 is exposed.

The filling layer 160, formed by filling up the opening 121, may have an uneven surface. To improve the quality of the gate electrode layer formed subsequently, the filling layer 160 needs to be planarized. In addition, a portion of the silicon oxide formed on the ILD layer 140 needs to be removed. A conventional chemical mechanical polishing (CMP) process may be utilized to planarize the filling layer 160, which is not described in detail here.

Figure 9:
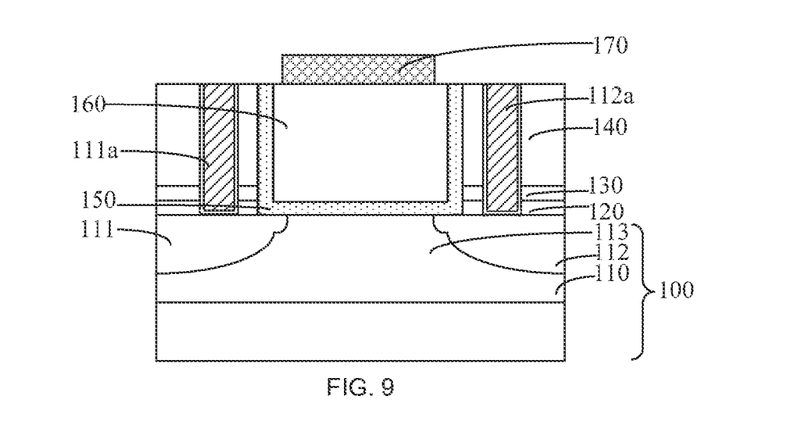

Referring to FIG. 9, by performing step S106, a gate electrode layer 170 is formed on the ILD layer 140 and the filling layer 160.

The gate electrode layer 170 may have a single-layer structure or a multi-layer stack structure. If the gate electrode layer 170 has a single-layer structure, the gate electrode layer 170 includes a conducting material, for example, polysilicon, doped polysilicon, Al, Cu, Ag or Au.

Preferably, the gate electrode layer 170 has a three-layer stack structure including a metal layer, a silicon oxide layer formed on the metal layer and a silicon nitride layer formed on the silicon oxide layer, which may improve the fatigue resistance of the metal layer and thus increase the life of the MEMS device.

Formation of the gate electrode layer 170 may include: forming a gate electrode film (not shown in FIG. 9) on the filling layer 160 and the ILD layer 140; forming a patterned photoresist layer corresponding to the gate electrode layer on the gate electrode film; and etching the gate electrode film by taking the patterned photoresist layer as a mask to form the gate electrode layer 170.

Figure 10:
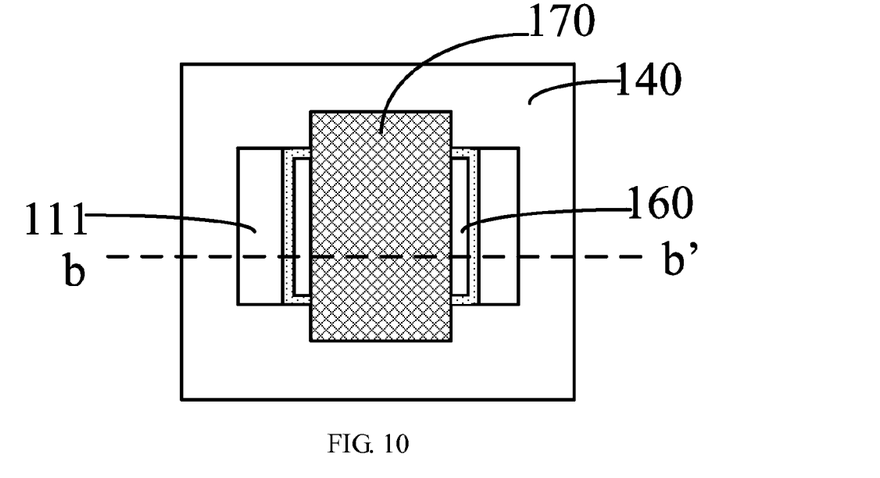

To clarify the embodiment, please refer to FIG. 10. FIG. 10 is a schematic top view of an intermediate structure after the formation of the gate electrode layer 170. FIG. 9 is a schematic cross-sectional view of the intermediate structure shown in FIG. 10 along b-b' direction. in FIG. 9, it is shown that the gate electrode layer 170 is formed on the filling layer 160 and the filling layer 160 is partially exposed by the gate electrode layer 170. In FIG. 110, it is shown that the gate electrode layer 170 includes portions on the ILD layer 140, and is spaced with the gate dielectric layer 150 by the filling layer 160, forming a structure like a floated bridge.

Figure 11:
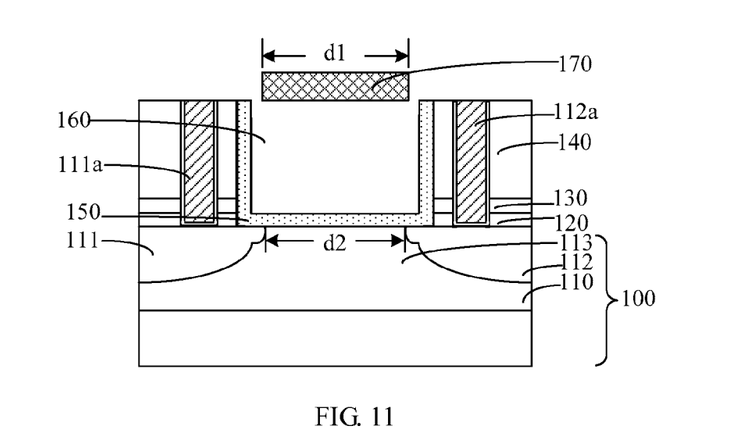

Referring to FIG. 11, by performing step S107, the filling layer 160 is removed.

The filling layer 160 may be removed by a selective erosion process. The intermediate structure is placed into an erosion solution which etches the filling layer 160 from the exposed portions thereof, until the filling layer 160 is removed.

After removing the filling layer 160, the gate electrode layer 170 is above the gate dielectric layer 150, and a gap is formed there-between. It should be noted that the gate electrode layer 170 should have a width d1 larger than a width d2 of the channel region 113 to ensure that the channel region 113 becomes conductive when the MEMS device is switched on.

A MEMS device and a method for forming the same are provided by embodiments of the present disclosure. The method can be compatible with the conventional semiconductor manufacturing process, therefore new materials and manufacturing techniques are not needed. The MEMS device has lower gate leakage current and can withstand higher voltage.

The invention is disclosed, but not limited, by preferred embodiments as above. Based on the disclosure of the invention, those skilled in the art can make any variation and modification without departing from the scope of the invention. Therefore, any simple modification, variation and polishing based on the embodiments described herein is within the scope of the present invention.

What is claimed is:

1. A method for forming a MEMS device, comprising:
providing a substrate with a well region formed therein, wherein a source region, a drain region and a channel region are formed in the well region;
forming an isolating layer on the substrate;
forming an opening in the isolating layer to expose the channel region and portions of the source region and the drain region neighboring the channel region;
forming a gate dielectric layer on a bottom surface of the opening;
forming a filling layer to fill up the opening, wherein a top surface of the filling layer levels with a top surface of the isolating layer;
forming a gate electrode layer on the filling layer and the isolating layer; and
removing the filling layer to form a gap between the gate electrode layer and the gate dielectric layer.

2. The method for forming a MEMS device according to claim 1, wherein the step for forming the gate electrode comprises: forming a gate electrode film on the filling layer and the isolating layer; forming a patterned photoresist layer corresponding to the gate electrode layer on the gate electrode film; and etching the gate electrode film using the patterned photoresist layer as a mask to form the gate electrode layer.

3. The method for forming a MEMS device according to claim 1, wherein the gate electrode layer exposes portions of the filling layer.

4. The method for forming a MEMS device according to claim 1, wherein the gate electrode layer has a single-layer structure or a multi-layer stack structure.

5. The method for forming a MEMS device according to claim 4, wherein the single-layer structure comprises conducting material.

6. The method for forming a MEMS device according to claim 4, wherein the gate electrode layer has a three-layer stack structure comprising a metal layer, a silicon oxide layer formed on the metal layer and a silicon nitride layer formed on the silicon oxide layer.

7. The method for forming a MEMS device according to claim 1, wherein the gate electrode layer comprises a width corresponding to a width of the channel region.

8. The method for forming a MEMS device according to claim 1, wherein the filling layer comprises a material with relatively high etching selectivity with the gate electrode layer and the gate dielectric layer.

* * * * *